United States Patent
Gonzalez Senosiain et al.

(10) Patent No.: US 9,608,620 B2
(45) Date of Patent: Mar. 28, 2017

(54) CONTROL SYSTEM AND CONTROL METHOD FOR CONTROLLING A SWITCHING DEVICE INTEGRATED IN AN ELECTRONIC CONVERTER AND SWITCHING CELL COMPRISING SAID SYSTEM

(71) Applicant: INGETEAM POWER TECHNOLOGY, S.A., Zamudio (Vizcaya) (ES)

(72) Inventors: Roberto Gonzalez Senosiain, Sarriguren (ES); Julian Balda Belzunegui, Sarrigueren (ES); Luis Perez Nicuesa, Sarriguren (ES)

(73) Assignee: INGETEAM POWER TECHNOLOGY, S.A., Zamudio (ES)

( * ) Notice: Subject to any disclaimer, the term of this patent is extended or adjusted under 35 U.S.C. 154(b) by 0 days.

(21) Appl. No.: 15/101,191

(22) PCT Filed: Dec. 3, 2013

(86) PCT No.: PCT/ES2013/070837
§ 371 (c)(1),
(2) Date: Jun. 2, 2016

(87) PCT Pub. No.: WO2015/082727
PCT Pub. Date: Jun. 11, 2015

(65) Prior Publication Data
US 2016/0308525 A1    Oct. 20, 2016

(51) Int. Cl.
*H03K 17/16* (2006.01)
*H02M 1/08* (2006.01)
(Continued)

(52) U.S. Cl.
CPC ......... *H03K 17/168* (2013.01); *H01L 31/042* (2013.01); *H02M 1/08* (2013.01);
(Continued)

(58) Field of Classification Search
CPC ........ H01L 2924/00; H01L 2924/1305; H02M 3/33592; H02M 3/3376
See application file for complete search history.

(56) References Cited

U.S. PATENT DOCUMENTS

| | | |
|---|---|---|
| 5,977,814 A | 11/1999 | Ishii |
| 2004/0027753 A1* | 2/2004 | Friedrichs ........ H03K 17/08142 361/90 |

(Continued)

FOREIGN PATENT DOCUMENTS

EP    0817381 A2    1/1998

OTHER PUBLICATIONS

International Search Report of PCT/ES2013/070837 dated Aug. 19, 2014.

*Primary Examiner* — Sibin Chen
(74) *Attorney, Agent, or Firm* — Sughrue Mion, PLLC

(57) ABSTRACT

The present invention relates to a control system and control method for controlling a switching device (1) integrated in an electronic converter, the object of which is to extend the working voltage range of the switching devices and thus increase the power of the electronic DC/AC converter which prepares the energy produced by a energy generating system and injects it into the electrical grid. It basically comprises a voltage source (3), a capacitance (7), a first gate resistor (21) and a second gate resistor (22), a first circuit formed by a series resistor (6) with a first diode (5), a second circuit formed by a second diode (4) and a connecting element (8) controlled by a control unit (12) that controls the opening and closing thereof. Another object of the present invention
(Continued)

is a switching cell for an electronic converter comprising said control system.

15 Claims, 16 Drawing Sheets

(51) Int. Cl.
*H01L 31/042* (2014.01)
*H02M 3/04* (2006.01)
*H02M 7/04* (2006.01)
*H02M 7/44* (2006.01)
*H03K 17/74* (2006.01)
*H02M 1/00* (2006.01)

(52) U.S. Cl.
CPC .............. *H02M 3/04* (2013.01); *H02M 7/04* (2013.01); *H02M 7/44* (2013.01); *H03K 17/74* (2013.01); *H02M 2001/0029* (2013.01)

(56) References Cited

U.S. PATENT DOCUMENTS

| | | |
|---|---|---|
| 2004/0070996 A1* | 4/2004 | Carr .................. H02M 3/33523 363/21.01 |
| 2007/0115038 A1 | 5/2007 | Higashi et al. |
| 2009/0066402 A1 | 3/2009 | Hiyama |
| 2011/0273206 A1 | 11/2011 | Lee |

* cited by examiner

State of the art

State of the art

State of the art

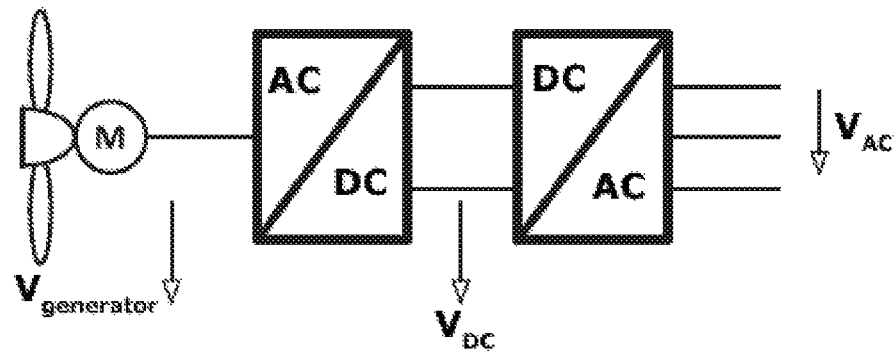
FIG. 5.1a
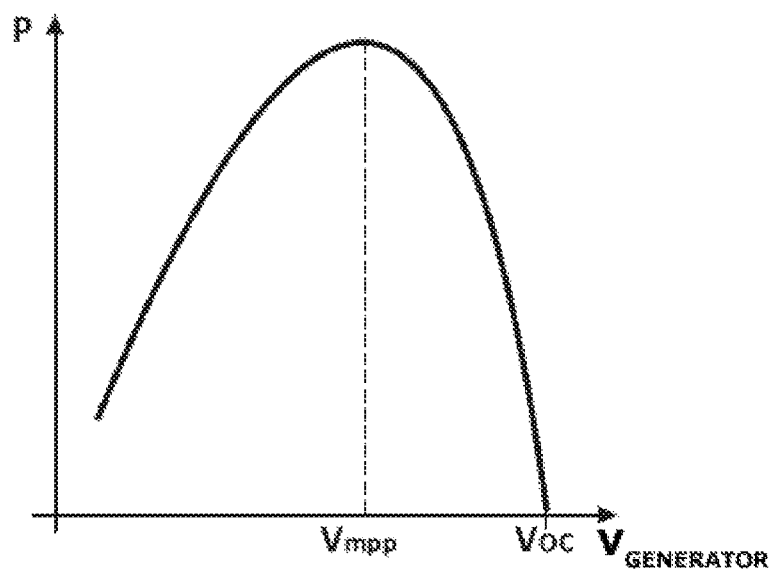
FIG. 5.1b

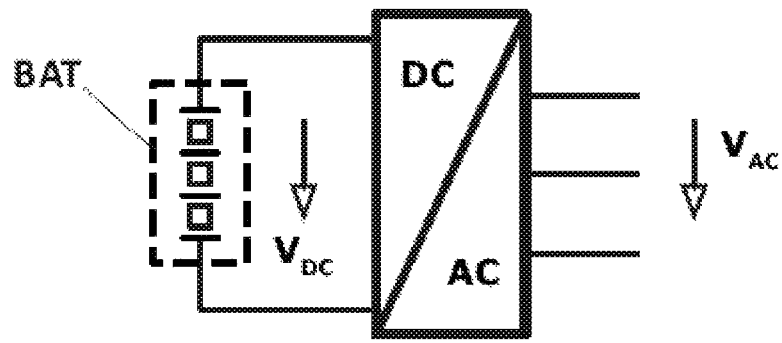
FIG. 5.2a
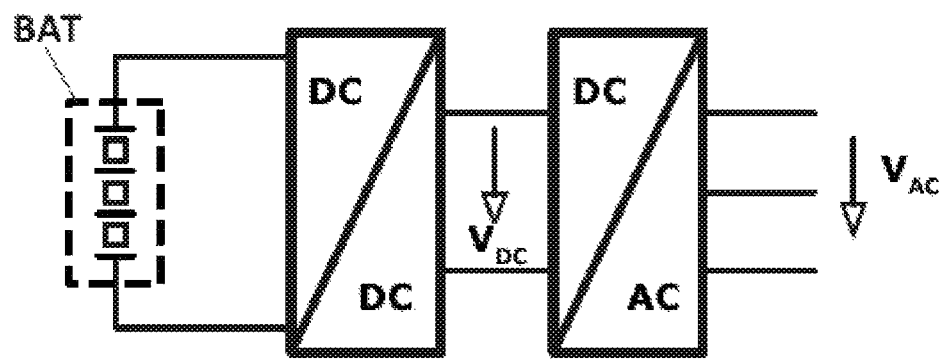
FIG. 5.2b
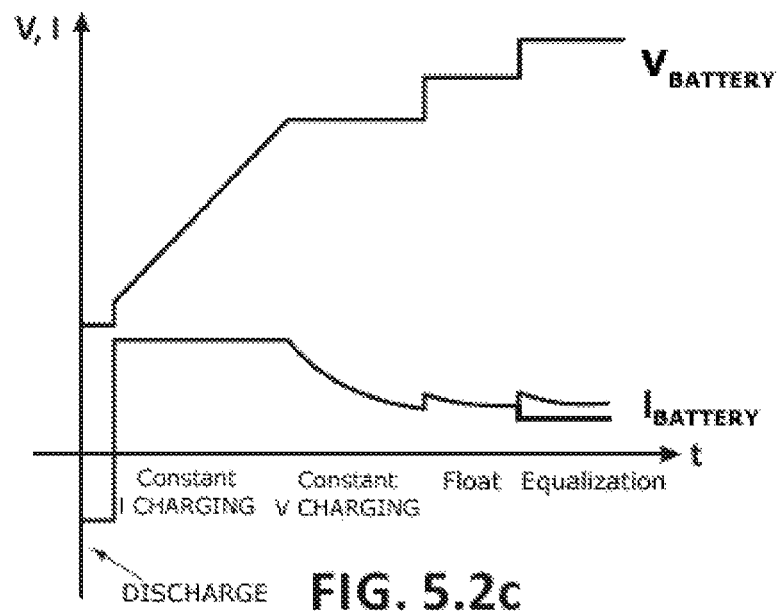
FIG. 5.2c

CONTROL SYSTEM AND CONTROL METHOD FOR CONTROLLING A SWITCHING DEVICE INTEGRATED IN AN ELECTRONIC CONVERTER AND SWITCHING CELL COMPRISING SAID SYSTEM

CROSS REFERENCE TO RELATED APPLICATIONS

This application is a National Stage of International Application No. PCT/ES2013/070837 filed Dec. 3, 2013, the contents of all of which are incorporated herein by reference in their entirety.

OBJECT OF THE INVENTION

The main field of application of the present invention is the industry intended for designing electronic devices, and more particularly for those conceived within the sector of power systems for converting photovoltaic solar energy. The invention could also be applied in other fields such as the wind power generation, energy generation by means of electrochemical cells or other devices providing continuous energy.

More specifically, the object of the invention is to extend the working voltage range in switching devices to successfully increase the power of the electronic DC/AC converter which prepares the energy produced by photovoltaic panels and injects it into the electrical grid, improving the cost and increasing the efficiency of the photovoltaic installation.

BACKGROUND OF THE INVENTION

Grid-connected photovoltaic installations are formed by an array of photovoltaic panels (also called photovoltaic generator) and an electronic DC/AC converter (hereinafter converter), also called inverter, which prepares the energy produced by the photovoltaic panels and injects it into the electrical grid, where DC is direct current and AC is alternating current.

FIG. 1a depicts what is understood as direct current voltage $V_{DC}$ of a converter for connecting to single-phase alternating current voltage $V_{AC}$ of the state of the art. FIG. 1b depicts what is understood as direct current voltage in a converter for connecting to three-phase alternating current voltage $V_{AC}$ of the state of the art. If the converter is connected directly to the photovoltaic panel, the direct current voltage $V_{DC}$ and the voltage of the photovoltaic panel will be the same. If the converter is connected to the photovoltaic panel by means of, for example, a DC/DC converter, the direct current voltage and the voltage of the photovoltaic panel will be different.

It is thus established that the value of the minimum direct current voltage is determined by the conversion structure of the converter used and by the value of the alternating current voltage (i.e., voltage of the electrical grid in grid-connected photovoltaic installations).

On the other hand, the value of the maximum direct current voltage that the converter can withstand is determined by the characteristics of the components used in the converter, the most critical elements generally being the capacitor used to stabilize the direct current voltage and the switching devices (e.g., transistors and/or diodes).

Transistors used in converters usually depend on converter topology, on the direct current voltage and on the power of the converter, and the most widely used transistors are MOSFETs (Metal-oxide-semiconductor Field-effect transistor) and IGBTs (Insulated Gate Bipolar Transistor). However, the breakdown voltages of these switching devices do not adapt to the specific needs of each converter but rather follow standard values such as 600 V, 1200 V and 1700 V, for example.

Photovoltaic installations require converters with a broad direct current voltage range that allows working in the range comprised between the maximum power point voltage (Vmpp) of the photovoltaic generator at maximum ambient temperature, and the open circuit voltage (Voc) at minimum ambient temperature. The value of these voltages will depend on the photovoltaic panel configuration used (number of panels in series), on the ambient temperature and on the technology thereof. FIG. 1c shows two power (W)-voltage (V) curves of a photovoltaic generator of the state of the art for one and the same irradiance and for different ambient temperature values ($P_1$=45° C. and $P_2$=−10° C.).

On the other hand, the design trend for photovoltaic installations is to increase direct current voltage in order to reduce Joule-effect losses in the direct current wiring of the photovoltaic installation. Nevertheless, if the direct current voltage increases up to limit values, situations may arise in which the switching devices of the converter work close to their physical limits (breakdown voltage).

Furthermore, by increasing the direct current voltage, the converter can be connected to higher-voltage grids, increasing the power of the converter, making the photovoltaic installation more cost-effective because it is able to deliver more power to the grid with the same hardware.

Currently, the maximum direct current voltage limit of a conventional photovoltaic installation is set at 1000 V due to insulation levels of the photovoltaic panels. These direct current voltage levels could damage converters with 1200 V transistor-type switching devices with conventional switching techniques because overvoltages caused during switching operations of the transistors due to parasitic inductances (particularly while switching off the transistor) could exceed the 1200 V limit.

As can be seen in FIG. 2 of the state of the art, converters are formed from elementary switching cells, formed by a capacitor C for stabilizing the direct current voltage, two transistors T1 and T2 in series and an output inductor L connected at the intermediate point of attachment of the transistors T1 and T2. Said FIG. 2 also shows parasitic inductances L3 and L4 between the capacitor C and the transistors T1 and T2, and the internal parasitic inductances L1 and L2 of the transistors T1 and T2, which depend on the manufacture thereof.

Parasitic inductances L3 and L4 must be reduced as much as possible in the design stage because the intense current variations in said parasitic inductances L3 and L4 while switching on and switching off the transistors T1 and T2 cause overvoltages in the transistors T1 and T2.

As is known, the on/off state of transistors is controlled through the gate-emitter voltage. Control of this voltage is performed through a controlled voltage source or driver D1 and D2 (hereinafter, voltage source) and a gate resistor Rg1 and Rg2 connected between each voltage source D1 and D2 and the gate G1 and G2 of each transistor T1 and T2. FIG. 2 depicts, in addition to the gate G1 and G2, the emitter E1 and E2, as well as the collector CL1 and CL2 of the transistors T1 and T2. The voltage source is capable of imposing different voltage levels at its output depending on a control signal sent from the control unit of the converter, for example. An example of voltage sources from state of the art can be AVAGO hcpl-316j or hcpl-3120 of, among others.

The dynamics of the gate-emitter voltage establish the rate of current variation in the transistor (current derivative) while switching it on and switching it off and therefore the overvoltages occurring in parasitic inductances. Therefore, the lower the ohmic value of the gate resistor the greater the current derivative.

Furthermore, there is a relationship between the dynamics of said gate-emitter voltage and switching losses in transistors which translates into the idea that the higher the switch-on speed, the fewer the losses.

Overvoltages produced by current variations in parasitic inductances while switching on and switching off the transistors are more critical while switching them off, where current derivatives exceeding switch-on current derivatives are reached.

A solution of the state of the art for reducing switch-off overvoltages can be seen in FIG. 3 (Semikron-Application Note AN 7003 Markus Hermwille) and consists of using different gate resistors ($R_{GT1}$, $R_{GT2}$) in switch-on and switch-off. However, this solution has the drawback of the working conditions being set, and therefore if the overvoltages are to be greatly reduced, losses are high.

Another alternative used for not working with voltages close to the limit voltages of the components of the converter can be seen schematically in FIG. 4a. It consists of adding unrelated elements to the converter that reduce the direct current voltage of the photovoltaic generator from its open circuit voltage Voc to a safe value, after which the switching devices of the converter start to work. Thus, for example, part of the energy from the photovoltaic panels can be consumed in controlled resistors (also known as chopper).

However, the preceding solutions have several drawbacks. One of them is the increase in the cost of the photovoltaic installation, and another is that they do not allow progressively increasing the output power, as is required by certain grid regulations.

So another method used in the state of the art for not working with voltages close to the limit voltages of the components of the converter is the method shown in FIG. 4b, which consists of integrating an auxiliary switching element or a linear power supply source that reduces the voltage of the photovoltaic generator between the photovoltaic generator and the converter.

Nevertheless, although such solutions can be useful in low-power installations, they are not useful in medium- and high-power installations because the losses produced in the auxiliary switching element are very high.

Finally, another also known and very widely used alternative method consists of using transistors with a higher voltage range. However, these solutions also have drawbacks such as the increase in losses of the converter and a significant increase in economic cost.

This problems herein considered for photovoltaic installations are also present in other generating systems such as, for example, wind power systems of the type depicted in FIGS. 5.1a, 5.1b and storage systems of the type depicted in FIGS. 5.2a, 5.2b, and 5.2c.

More specifically:

FIG. 5.1a shows a wind power topology formed by a wind-power generator of the type called back-to-back formed by two converters, a first machine-side AC/DC converter and a second grid-side DC/AC converter.

FIG. 5.1b shows the power-voltage curve of the generator characteristic of a wind-power generator. The working point is usually in the voltages providing maximum power (Vmpp) but under certain circumstances working with higher voltages (close to the Voc) may be interesting.

FIG. 5.2a shows a storage system formed by an array of electrochemical cells forming the battery (BAT) and a converter which can be a DC/AC or DC/DC converter for connecting to single-phase alternating current voltage of the state of the art.

FIG. 5.2b shows a storage system formed by an array of electrochemical cells forming the battery (BAT) and a converter which can be a DC/AC or DC/DC converter for connecting to three-phase alternating current voltage of the state of the art.

FIG. 5.2c shows a diagram showing the evolution of the current (I) and voltage (V) in different operating stages of the battery (discharge, constant current charging, constant voltage charging, float, equalization). As can be seen, during the equalization stage the voltage of the array of electrochemical cells forming the battery (BAT) is higher than in the usual operating stages (discharge, constant current charging, constant voltage charging, float).

Therefore, a control system for any type of converter (DC/DC or DC/AC or AC/DC) which further has switching devices working with direct current voltages close to the breakdown voltages is necessary in the state of the art.

DESCRIPTION OF THE INVENTION

The system and method proposed in the present invention solve the drawbacks of the state of the art discussed above as it allows modifying the switch-on and switch-off conditions of a switching device of an electronic converter, hereinafter converter, for example, DC/AC or DC/DC or AC/DC converter, allowing the switching device to work with voltages closer to its breakdown voltage and increasing the maximum direct current voltage. This modification can be done dynamically, i.e., the system can be activated or deactivated depending on the value of the direct current voltage.

The invention consists of a system and a method to control the current derivative through a switching device by means of the gate voltage thereof, particularly during switch-off, and to thus control the overvoltages occurring in parasitic inductances.

The elements of a transistor-type three-terminal switching device are as follows: in the case of IGBT, collector (C), gate (G), emitter (E); and in the case of a MOSFET, drain (D), gate (G), source (S). For the sake of simplification, both the emitter in the case of using IGBT and the source in the case of using MOSFET are hereinafter referred to as emitter of the switching device. Likewise, both the collector in the case of using IGBT and the drain in the case of using MOSFET are hereinafter referred to as collector of the switching device.

The elements making up the control system for controlling the gate voltage of the switching device of the proposed invention are as follows:

A voltage source or driver.
A capacitance.
A first circuit formed by a resistor and a first diode.
A second circuit formed by a second diode.
A connecting element controlled by a control unit that controls the opening and closing thereof such that if the connecting element is closed the system of the invention will be connected, and if the connecting element is open the system of the invention will not be connected; and
At least two gate resistors.
such that:

the positive connection of the voltage source is connected to a first gate resistor;

a second gate resistor is connected to the gate of the switching device, and the two gate resistors are connected at an intermediate point.

where at said intermediate point the following are connected:

The first circuit formed by a resistor in series with a first diode, where the anode of the first diode is attached to the intermediate point and the cathode of the first diode is attached to the resistor. At the same time, the other end of the resistor is attached to a linkage point.

The second circuit formed by a second diode, where the cathode of the second diode is attached to the intermediate point and the anode of the second diode is attached to the linkage point.

and where furthermore:

The linkage point is attached to the capacitance which in turn is in series with one end of the connecting element. The other end of the connecting element is connected to a common point. The common point has the negative connection of the voltage source and the emitter of the switching device.

Therefore, while switching on the switching device with the connecting element closed, the voltage source applies positive voltage to the gate of the switching device. The voltage is applied through the gate resistors (first gate resistor and second gate resistor); furthermore, the capacitance is charged through the first circuit (formed by the first diode and the resistor). The order of magnitude of the resistor of the first circuit must be greater than the second gate resistor so that the system of the invention does not affect the switch-on dynamics the switching device, i.e., so that the current circulates towards the gate of the switching device. Voltages in the gate of the switching device and in the capacitance will be equal to those of the voltage source. The resistor of the first circuit will have a value that allows charging the capacitance for the shorter switch-on time to be achieved in the switching device.

On the other hand, while switching off the switching device with the connecting element closed, the voltage source applies a voltage that discharges the capacitance through the second diode of the second circuit and the first gate resistor. In this case, the voltage of the gate of the switching device will no longer be the voltage of the voltage source but rather is the voltage established by the capacitance through the second diode and the second gate resistor. The dynamics thereof are thus controlled by means of the first gate resistor and the value of the capacitance, making the switch-off time increase with respect to the solutions in the state of the art.

When the connecting element is open, switch-on and switch-off are performed through the first and second gate resistors. Therefore, said resistors are what establish the switch-on and switch-off times of the switching device.

The switch-on and switch-off orders of the switching device are assigned from a control unit of the converter to the voltage source or driver. Furthermore, the control unit of the connecting device can be dependent on or independent of the control unit of the converter, or it can be part of same.

Therefore, the control system described above is integrated in the elementary switching cell formed by two switching devices such that one of said systems is added for each of the switching devices that said cell has.

On the other hand, the switching devices have a delay between the switch-on and switch-off order which is applied in the gate and the actual status (on-off) thereof. In the elementary switching cell, to switch on one device the other device must be switched off because otherwise, a short-circuit will occur. Therefore, a switch-on order of a device must be given in a later time which is greater than the switch-off delay of the other device. This time between the switch-off order of one device and the switch-on order of another device is called dead time. When the system of the invention is active, the dead time must be increased to prevent both switching devices from being switched on at the same time since the switch-off dynamics are slower.

The proposed invention allows modifying the switch-on and switch-off conditions of switching devices by switching on and switching off the connecting device by means of the control unit, preventing unnecessary losses in switching devices when working at direct current voltages that are not close to the breakdown voltages, for example.

DESCRIPTION OF THE DRAWINGS

To complement the description that is being made and for the purpose of aiding to better understand the features of the invention according to a preferred practical embodiment thereof, a set of drawings is attached as an integral part of said description in which the following has been depicted with an illustrative and non-limiting character:

FIGS. 5.1a and 5.1b schematically show the operating diagram and performance graph of wind power generating systems.

FIGS. 5.2a, 5.2b, 5.2c schematically show the operating diagram and performance graph of the storage systems.

FIG. 10b shows the electronic diagram of a variant of the embodiment shown in FIG. 10a.

POSSIBLE PRACTICAL EMBODIMENTS OF THE INVENTION

Figure 1A:
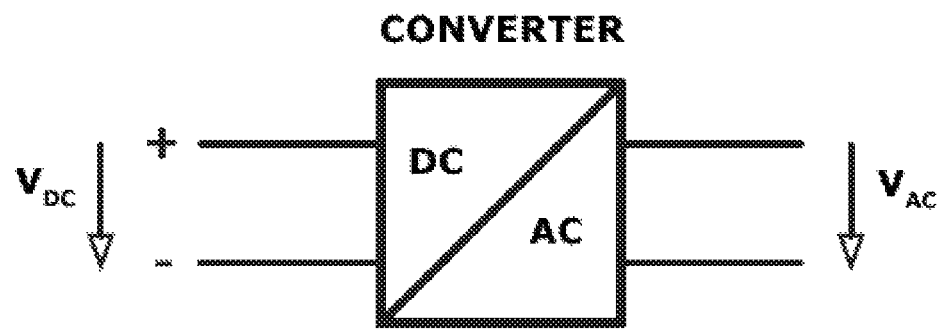
FIGS. 1a and 1b show respective schematic drawings with connection examples of a converter for connecting to single-phase alternating current voltage and three-phase alternating current voltage, respectively.
Figure 1B:
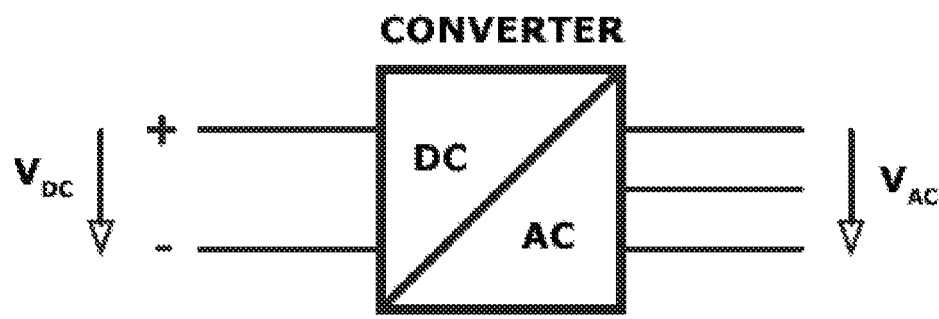
Figure 1C:
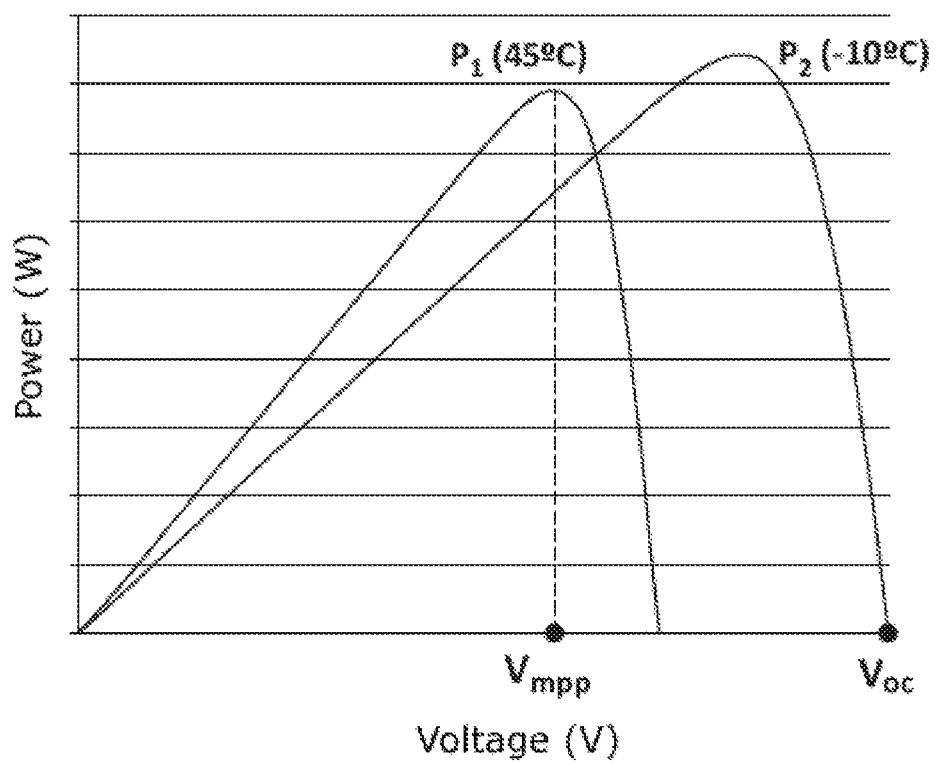
FIG. 1c shows a diagram in which two power (W-voltage (V) curves of a photovoltaic generator are reproduced for one and the same irradiance and for different ambient temperature values.
Figure 2:
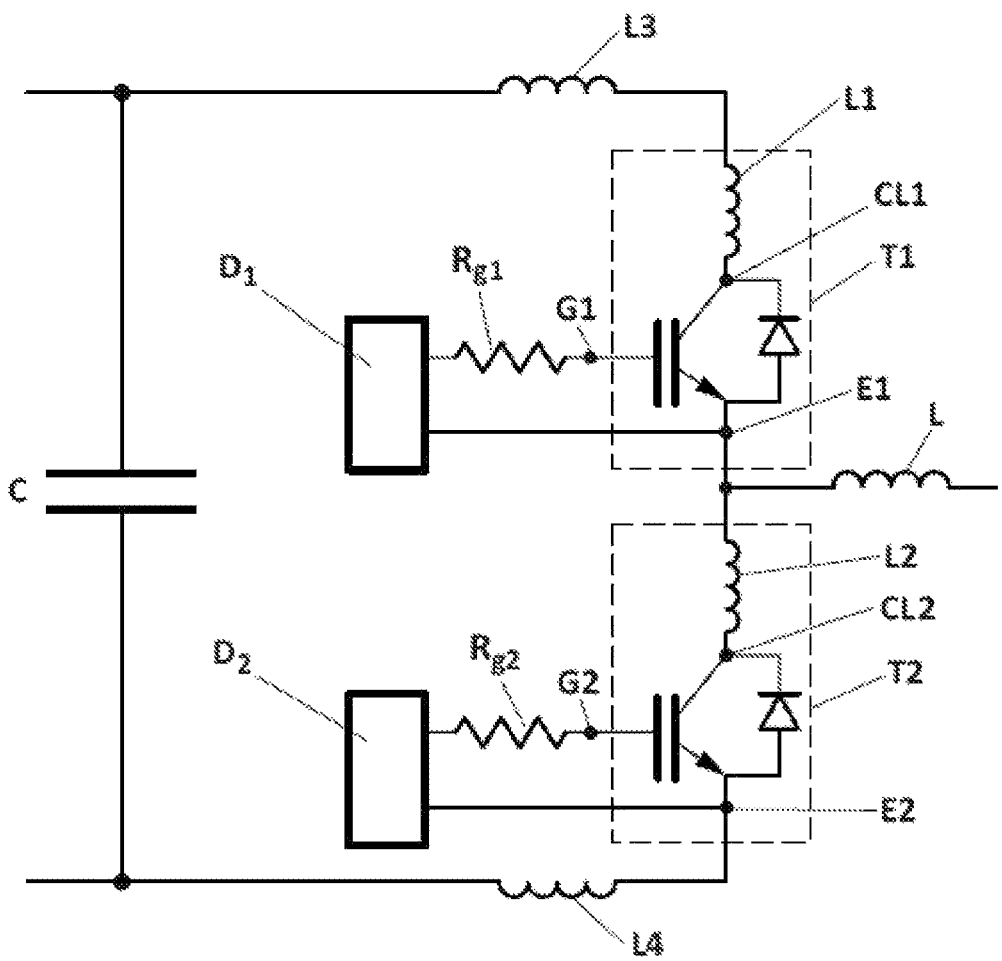
FIG. 2 shows the electronic diagram of a basic switching cell according to the state of the art as well as the parasitic inductances thereof.
Figure 3:
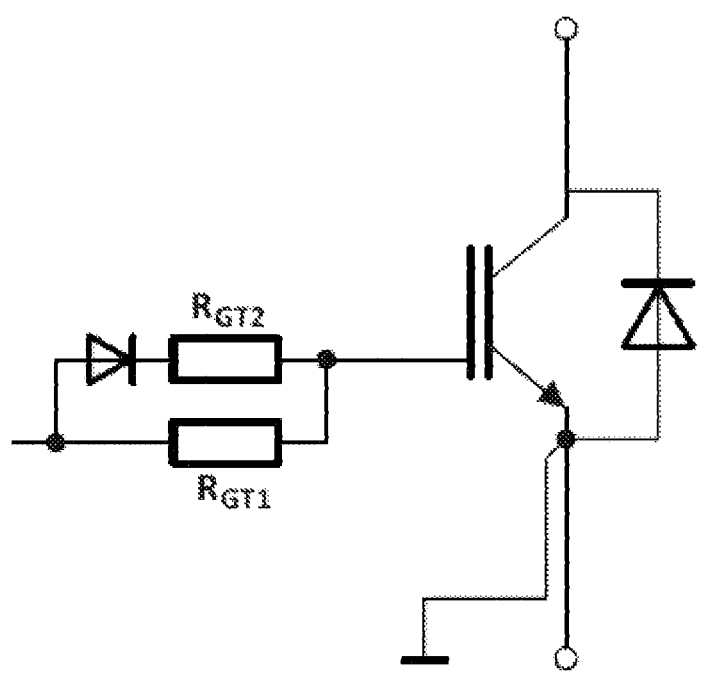
FIG. 3 shows the electronic diagram of a solution of the state of the art in which different gate resistors are used in switch-on and in switch-off.
Figure 4A:
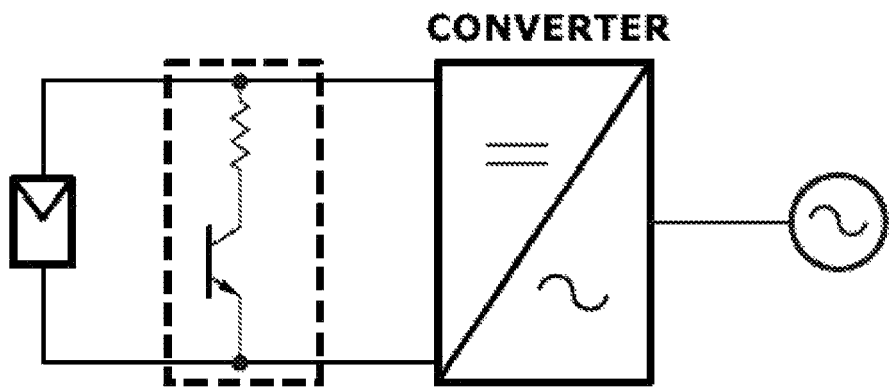
FIG. 4a shows the electronic diagram of another solution of the state of the art in which controlled resistors (also known as chopper) are included.
Figure 4B:
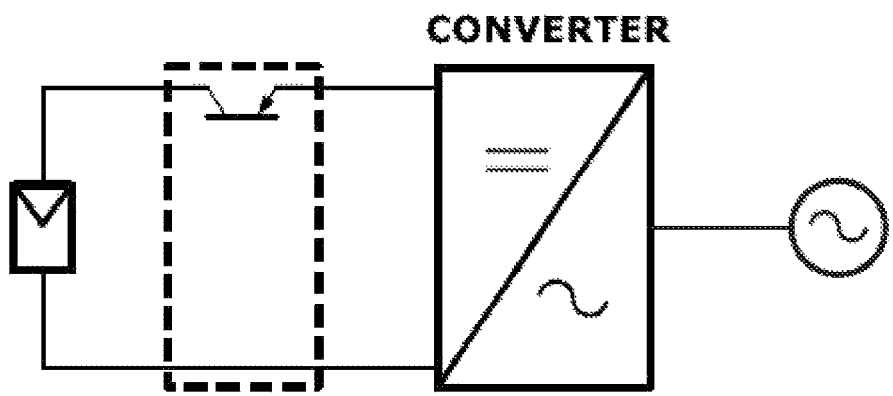
FIG. 4b shows the electronic diagram of another solution of the state of the art in which an auxiliary switching element is included.
Figure 6:
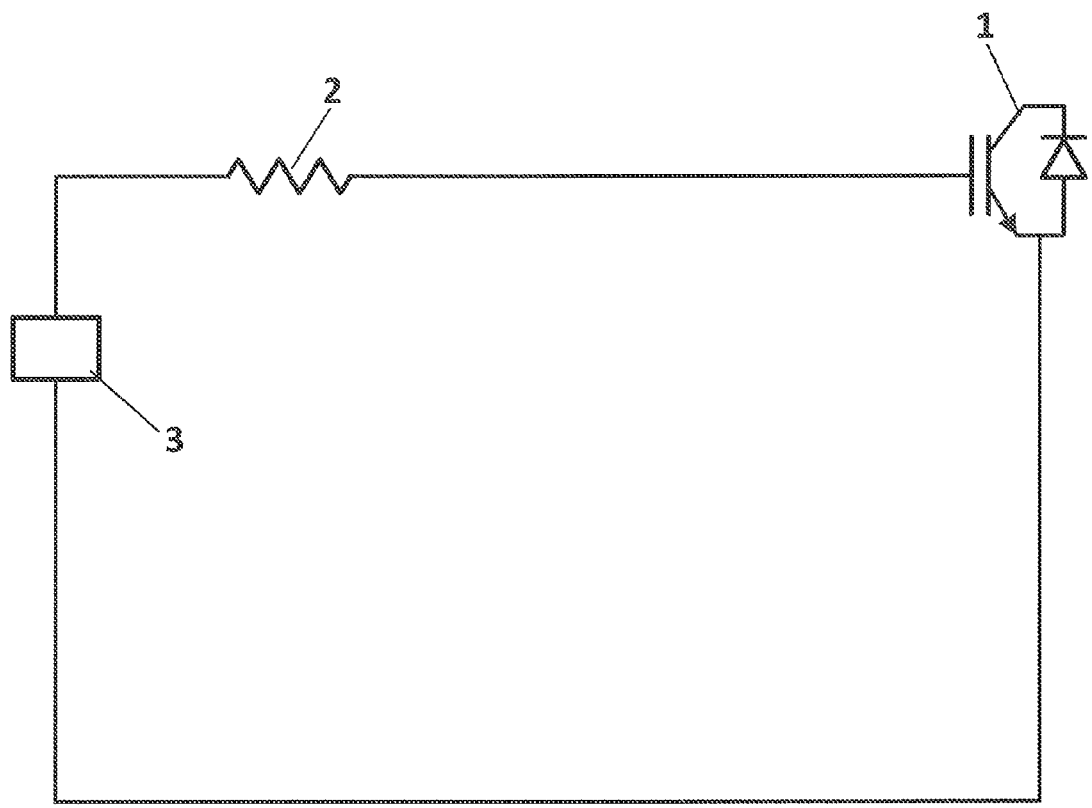
FIG. 6 schematically shows the elements making up the gate voltage control circuit of a transistor according to the state of the art.

FIG. 6 shows the conventional structure of the state of the art of a switching device (1) and it consists of a voltage source or driver (3) and a resistor (2) connected in series.

As previously mentioned, the system of the invention relates to a particular structure of an elementary switching cell which an electronic converter (hereinafter converter, for example, DC/AC or DC/DC or AC/DC) of, for example, photovoltaic generators, generators or electrochemical cells and wind-power generators, among others, has. The objective is to inject the electric energy produced by the generators into the electrical grid, for example, such that the overvoltages withstood by their switching devices, transistors, for example, are limited.

This is achieved by means of controlling the current derivative through the MOSFET- or IGBT-type switching device by means of its gate voltage, particularly during switch-off.

Figure 7:
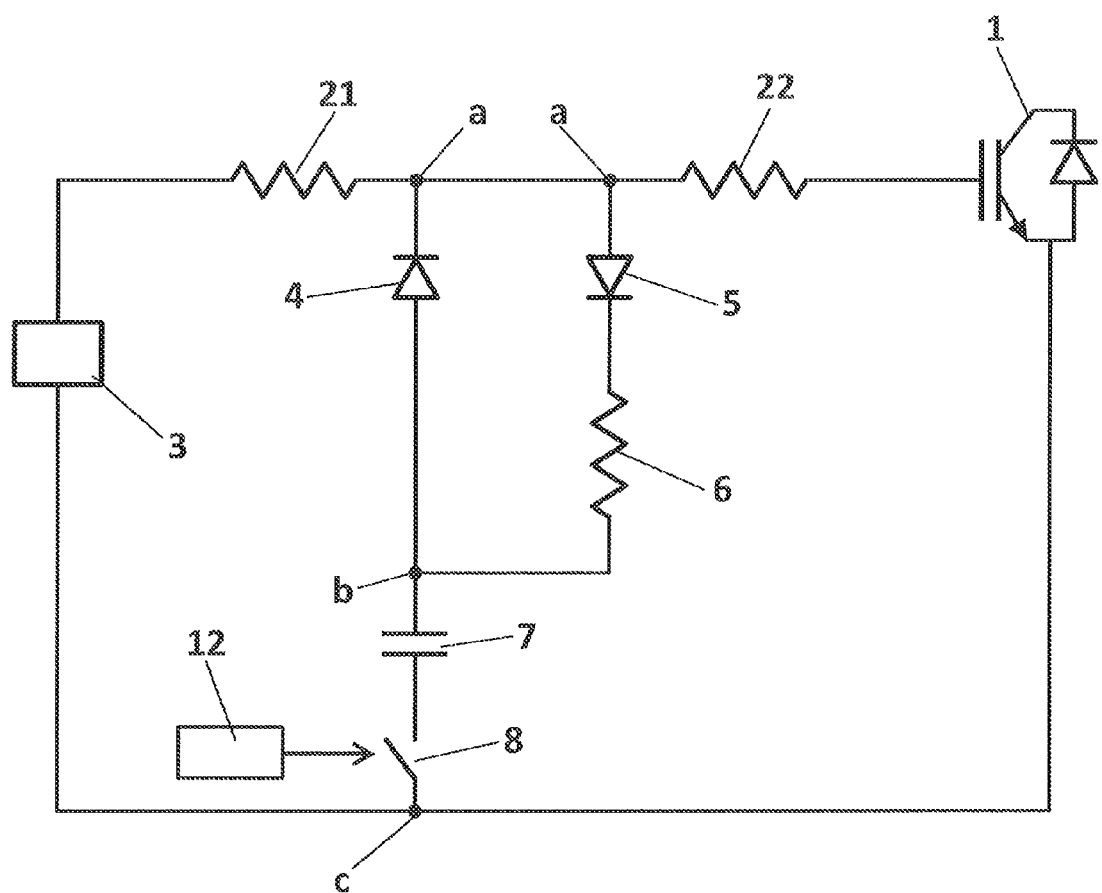
FIG. 7 shows the electronic diagram of a possible practical embodiment of the invention.

To that end and according to a preferred embodiment shown in FIG. 7, the control system for controlling a transistor-type three-terminal switching device (1) is defined: in the case of IGBT, collector (C), gate (G), emitter (E); and in the case of MOSFET, drain (D), gate (G), source (S). For the sake of simplification, both the emitter in the case of using IGBT and the source in the case of using MOSFET are hereinafter referred to as emitter of the switching device. Likewise, both the collector in the case of using IGBT and the drain in the case of using MOSFET are hereinafter referred to as collector of the switching device.

The control system of the invention is integrated in a converter and comprises:
 A voltage source or driver (3);
 A capacitance (7);
 A first circuit formed by a resistor (6) and a first diode (5);
 A second circuit formed by a second diode (4);
 A connecting element (8) controlled by a control unit (12) that controls the opening and closing thereof such that if the connecting element (8) is closed the system of the invention will be connected, and if the connecting element (8) is open the system of the invention will not be connected; the connecting element can be a MOSFET-type connecting element, a bipolar transistor, a switch, a relay, among others;
 At least a first gate resistor (21) and a second gate resistor (22) connected in series between the positive connection of the voltage source (3) and the gate of the switching device (1) such that:
  the first gate resistor (21) is connected to the positive connection of the voltage source (3);
  the second gate resistor (22) is connected to the gate of the switching device (1), and
  the two gate resistors (21, 22) are connected at an intermediate point (a).
 where at said intermediate point (a) the following are furthermore connected:
  The first circuit formed by a resistor (6) in series with a first diode (5), where the anode of the first diode (5) is attached to the intermediate point (a) and the cathode of the first diode (5) is attached to one end of the resistor (6). At the same time, the other end of the resistor (6) is attached to a linkage point (b).
  The second circuit formed by a second diode (4), where the cathode of the second diode (4) is attached to the intermediate point (a) and the anode of the second diode (4) is attached to the linkage point (b). and where furthermore:
  The linkage point (b) is attached to the capacitance (7) which in turn is in series with one end of the connecting element (8). The other end of the connecting element (8) is connected to a common point of the circuit (c). The common point (c) has the negative connection of the voltage source (3) and the emitter of the switching device (1).

Figure 8:
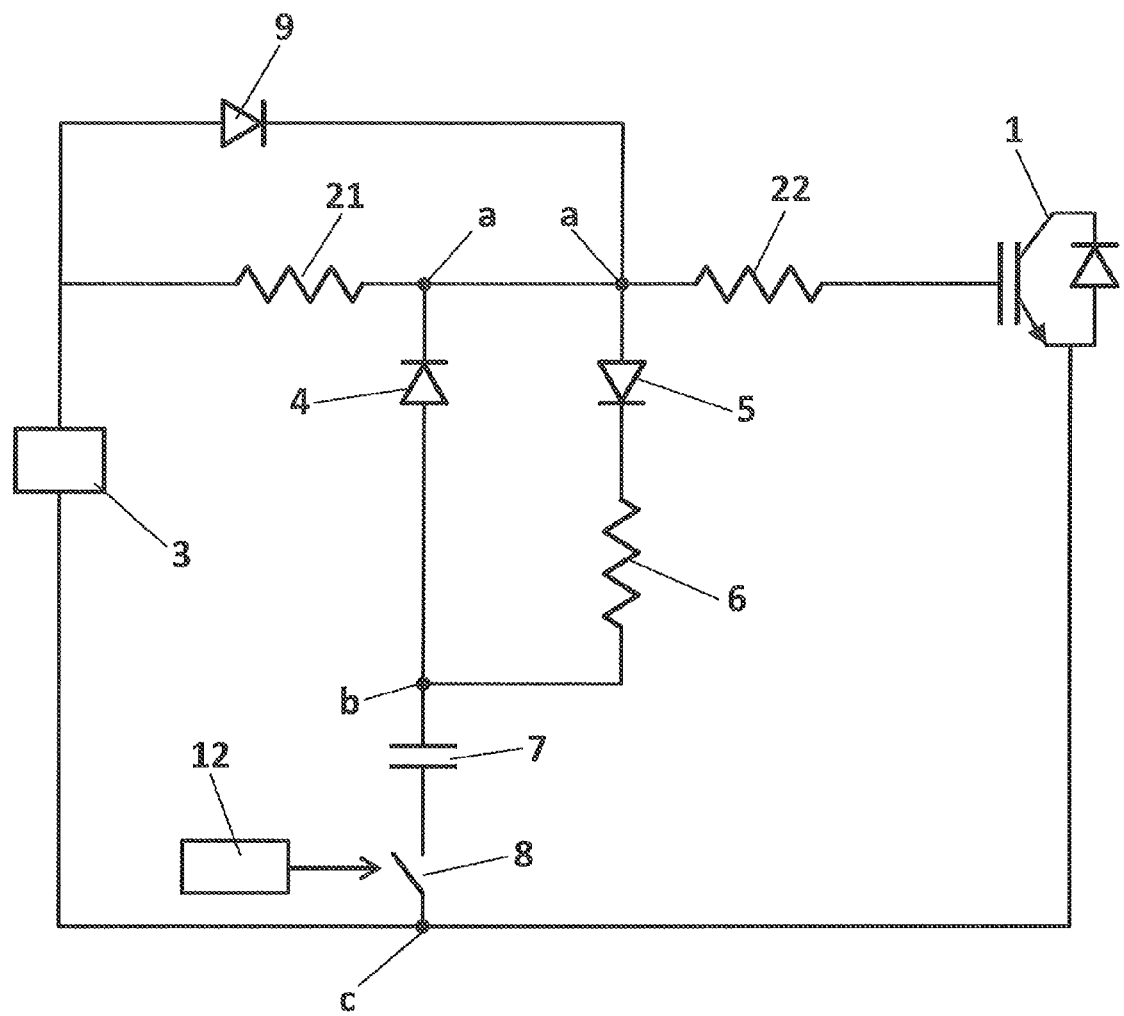
FIG. 8 shows the electronic diagram of another practical embodiment of the invention.

Another possible practical embodiment of the invention is that shown in FIG. 8, where a diode (9) in parallel with the first gate resistor (21) is added between the voltage source (3) and the intermediate point (a), the anode of the diode (9) in parallel being connected to the positive connection of the voltage source (3) and the cathode of the diode (9) in parallel being connected to said intermediate point (a).

This embodiment achieves participation of only the second gate resistor (22) and not the first gate resistor (21) while switching on the switching device. It thus increases the switch-on time of the switching device.

Figure 9:
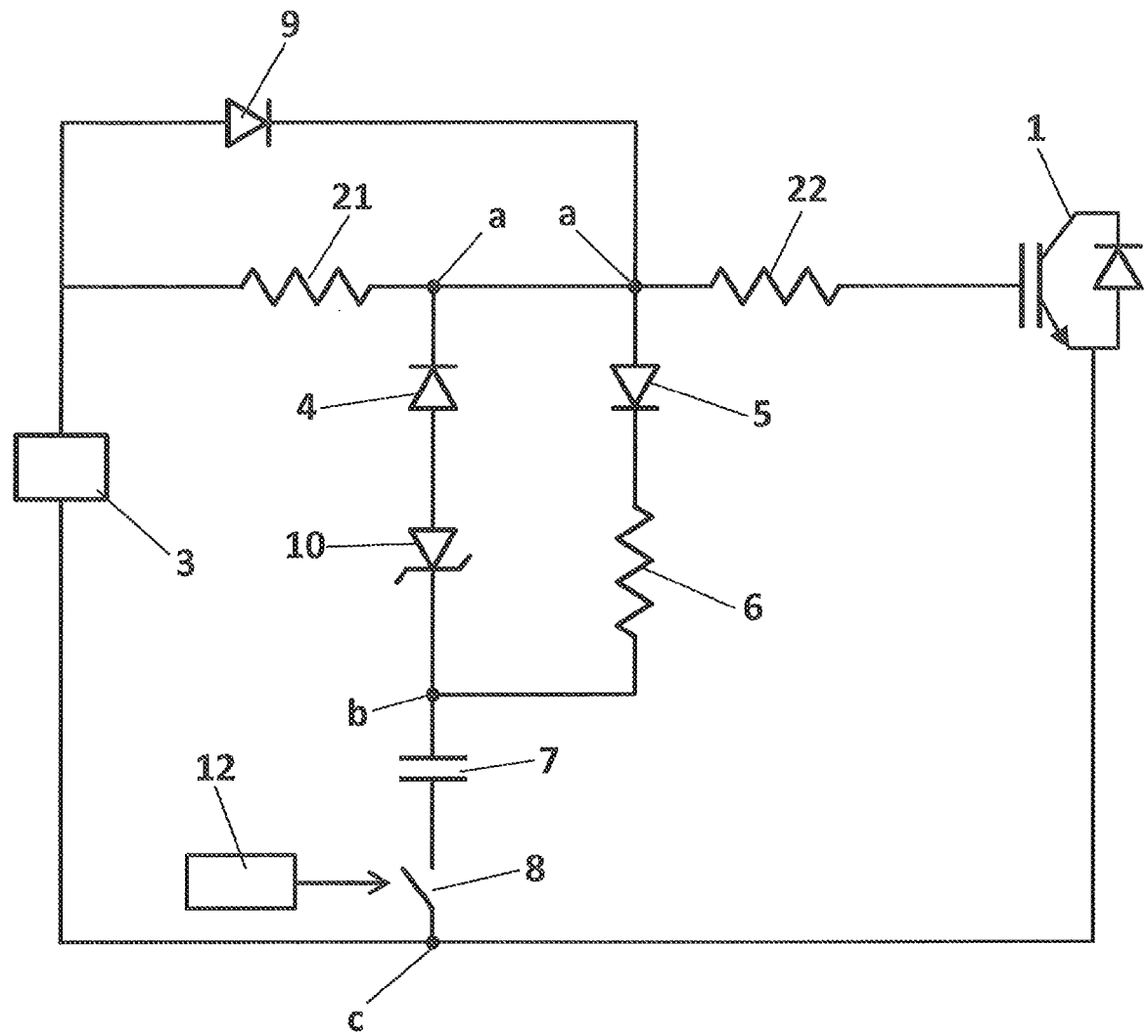
FIG. 9 shows the electronic diagram of yet another practical embodiment of the invention.

FIG. 9 shows another possible practical embodiment where in addition to the diode (9) in parallel of the preferred embodiment shown in FIG. 8, a Zener diode (10) is included in the second circuit (formed by the second diode (4)) such that said Zener diode (10) is in series with the second diode (4) such that the anode of the second diode (4) is connected to the anode of the Zener diode (10), and the cathode of the Zener diode (10) is connected to the linkage point (b).

This practical embodiment achieves quicker switch-off dynamics of the switching device, thus reducing the necessary dead times. The voltage of the gate of the switching device will no longer be the voltage of the voltage source but rather is the voltage established by the capacitance through the second diode (9), the voltage of the Zener diode (10) and the second gate resistor (22).

Figure 10A:
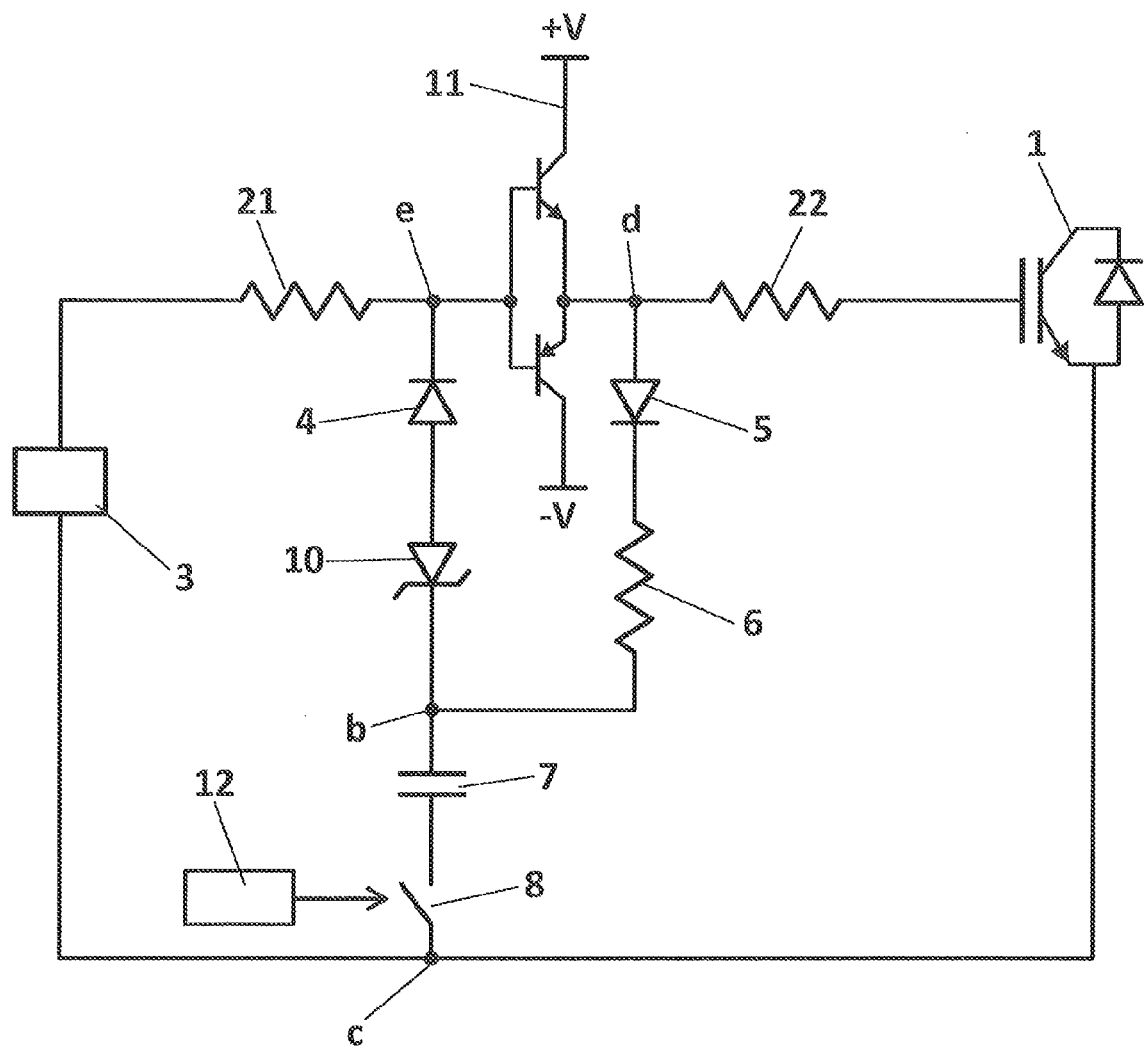
FIG. 10a shows the electronic diagram of a last practical embodiment of the invention.
Figure 10B:
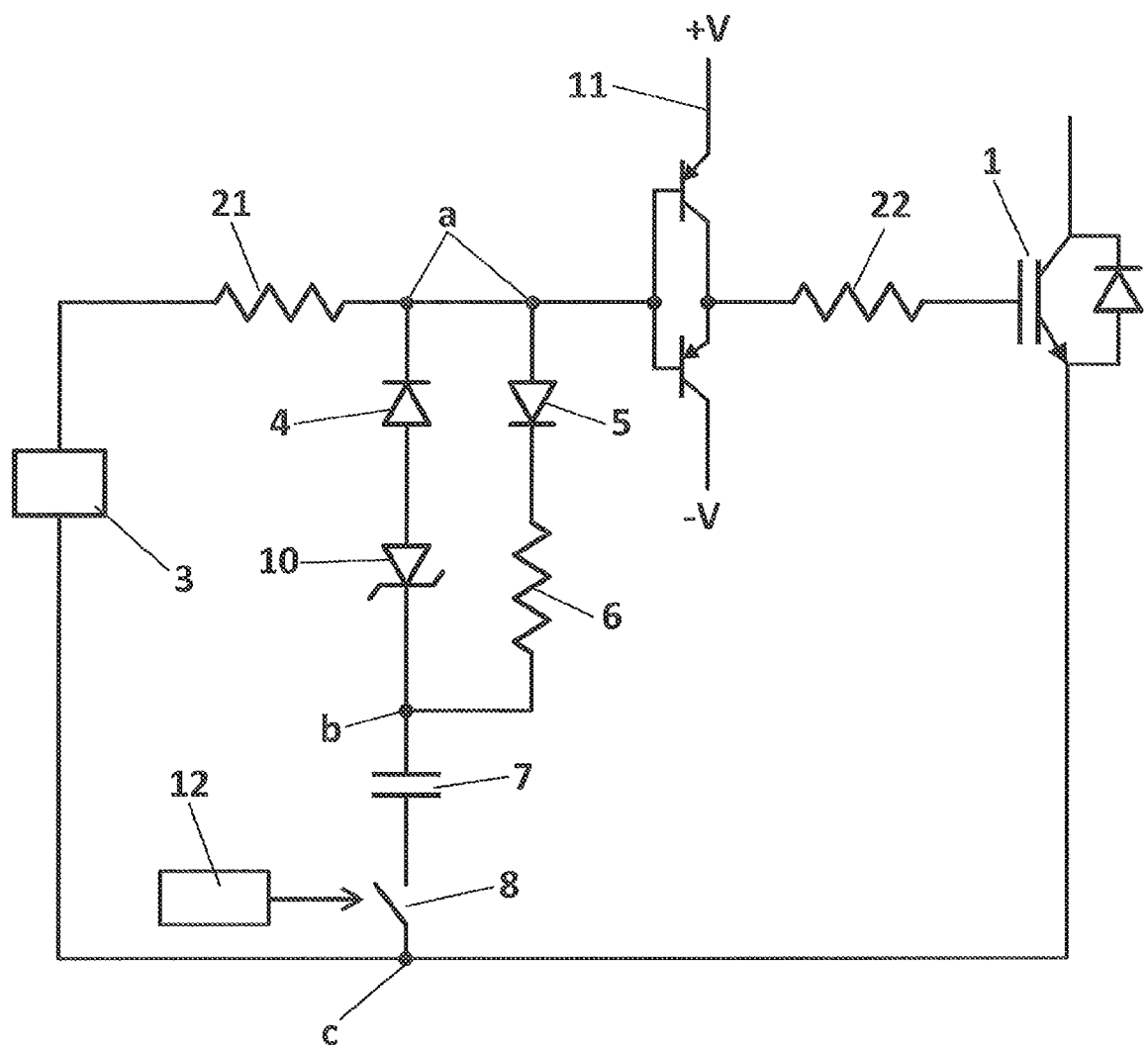

Another possible practical embodiment shown in FIG. 10a, which consists of adding to the embodiment of FIG. 7 a class B amplifier stage (11), such as a push-pull device, for example, which allows increasing the current carrying capacity and therefore using a higher powered switching device (1) or several switching devices (1) in parallel. Furthermore, and as seen in said FIG. 10a, a Zener diode (10) is included in the second circuit formed by the second diode (4) such that said Zener diode (10) is in series with the second diode (4) such that the anode of the second diode (4) is connected to the anode of the Zener diode (10), and the cathode of the Zener diode (10) is connected to the linkage point (b). The amplifier stage (11) is connected between a first intermediate point (e) and a second intermediate point (d), the first intermediate point (e) being defined by the attachment of the second circuit and the first gate resistor (21), and the second intermediate point (d) being defined by the first circuit and the second gate resistor (22). The class B amplifier stage (11) can also be connected between the second gate resistor (22) and the intermediate point (a) as can be seen in FIG. 10b.

Figure 11:
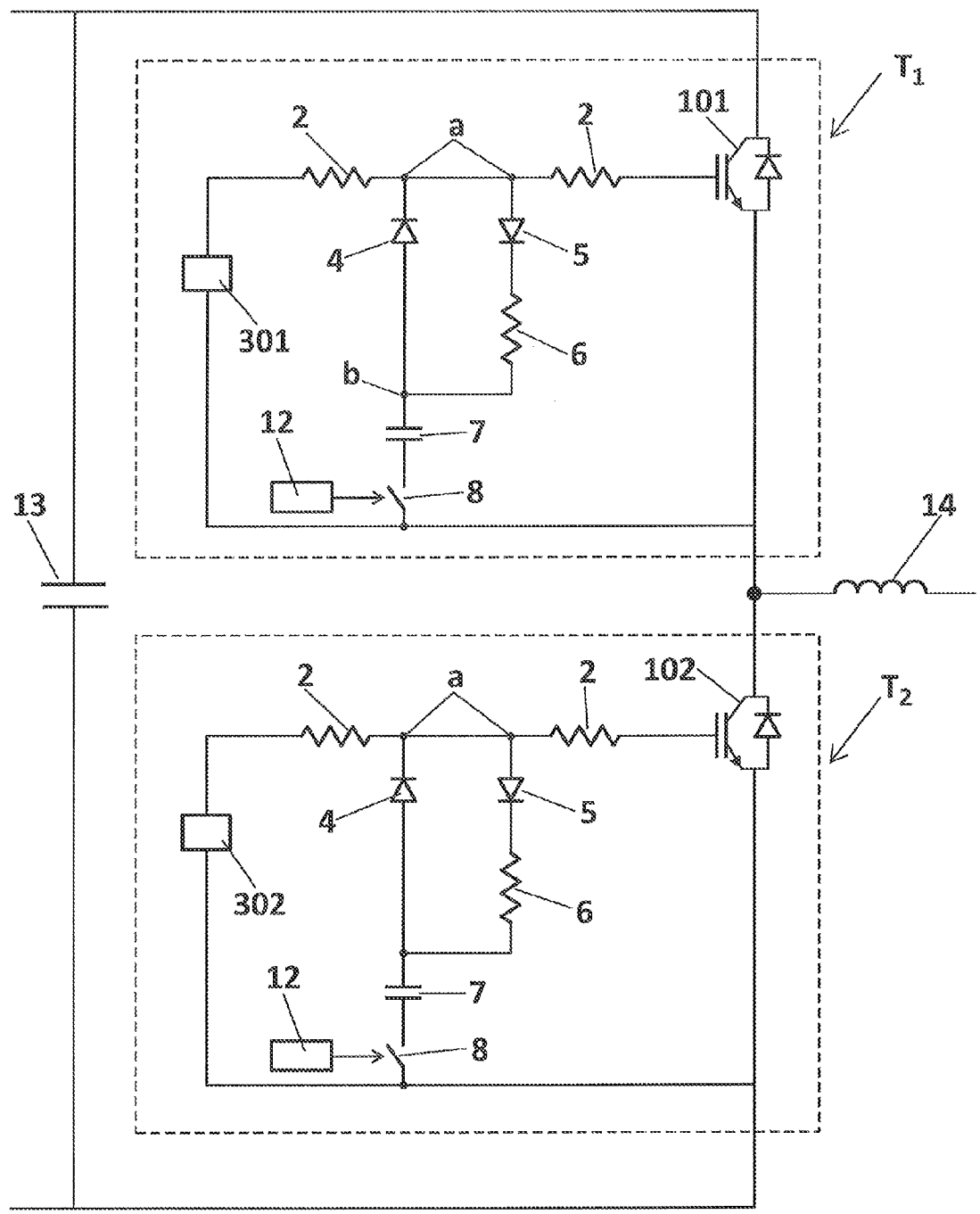
FIG. 11 shows the electronic diagram of an elementary switching cell formed by two transistors according to the solution proposed by the invention in FIG. 7.

Therefore, according to the foregoing and by way of example, FIG. 11 shows the electronic diagram of an elementary switching cell according to the system of the invention formed by two control systems (T1 and T2) for controlling respective switching devices (101 and 102)

according to the preferred embodiment shown in FIG. 7. This embodiment in an elementary switching cell is also valid for the preferred embodiments shown in FIGS. 8, 9 and 10. Furthermore, said figure shows a capacitor for stabilizing the direct current voltage (13) and an output inductor (14) connected at the point of attachment of the switching devices (101, 102).

Figure 12:
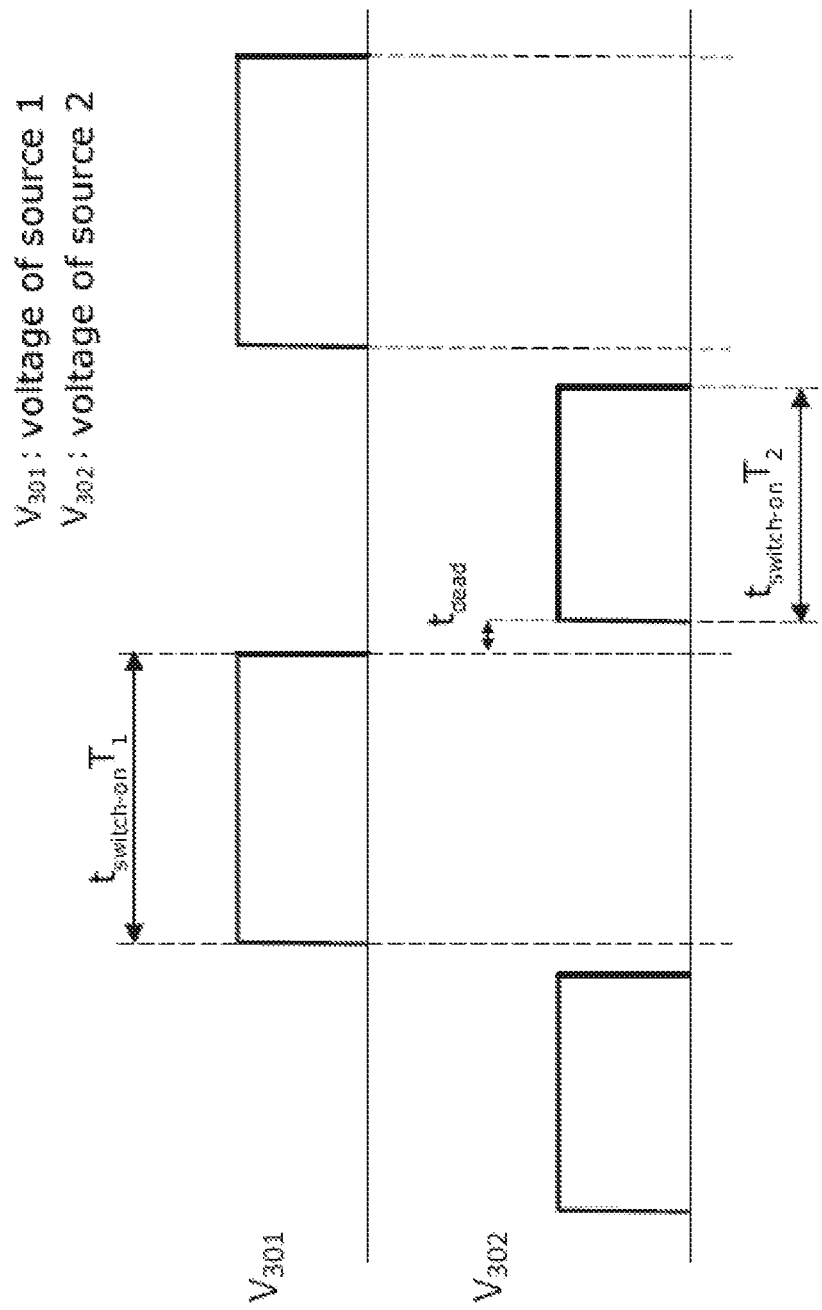
FIG. 12 shows a graph in which the switch-on times of each transistor of an elementary switching cell as well as the dead time for each voltage source are represented.

On the other hand, FIG. 12 shows a graph in which the switch-on times of each switching device (101, 102) located respectively in the control systems (T1, T2) of the circuit of FIG. 11 ($t_{switch-on}$ T$_1$ and $t_{switch-on}$ T$_2$ respectively) as well as the dead time ($t_{dead}$) for each driver or voltage source (V$_{301}$ and V$_{302}$) are represented, where V$_{301}$ is the voltage applied to the gate of the upper switching device T1 of the elementary switching cell and V$_{302}$ is the voltage applied to the gate of the lower switching device T2 of the elementary switching cell of the circuit of said FIG. 11.

Finally, the system of the invention can have different control units both for the converter and for the voltage source (3). In a preferred embodiment, the control unit (132) of the converter and the control unit (133) of the voltage source are independent from one another. In a second preferred embodiment, the control unit (132) of the converter integrates the control unit (133) of the voltage source. In a third preferred embodiment, the control unit (132) of the converter integrates the control unit (133) of the voltage source and the control unit (12) of the connecting element (8).

Figure 13:
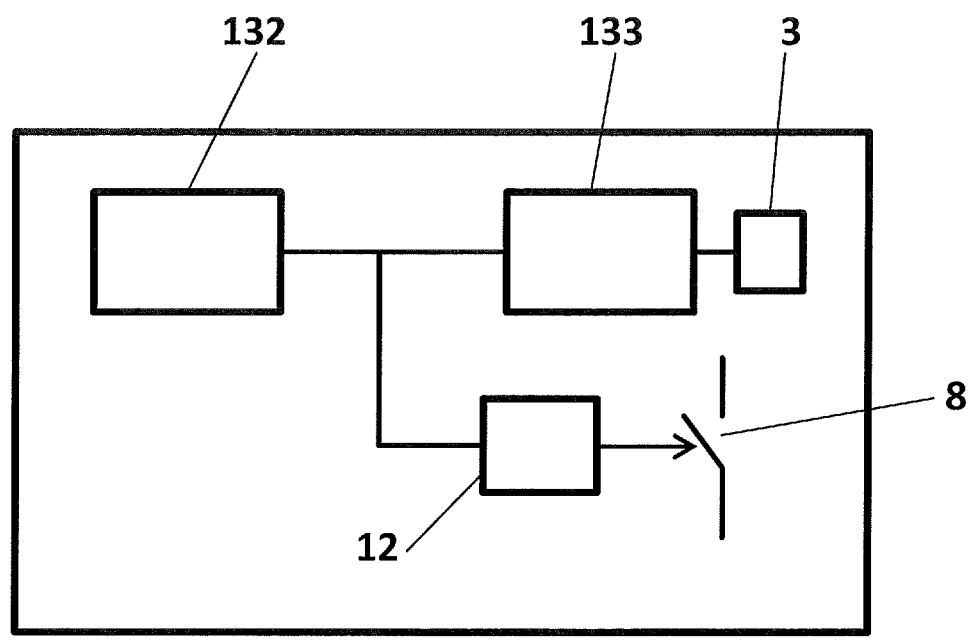
FIG. 13 schematically shows a possible configuration of the control structure for controlling the switching device integrated in a converter of the invention.

FIG. 13 shows a possible embodiment in which both are independent and the control unit (132) of the converter controls both the control unit (133) of the voltage source (3) and the control unit (12) of the connecting element (8).

Based on the foregoing, the present invention describes an efficient and cost-effective method for controlling a switching device of an electronic converter such that overvoltage at the time of switching is minimized and it allows safely using for example, 1200 volt transistor-type switching devices for 1000 volt applications.

The invention claimed is:

1. Control system for controlling a switching device (1) integrated in an electronic converter, characterized in that it comprises:
   a voltage source (3),
   a capacitance (7);
   at least a first gate resistor (21) and a second gate resistor (22)
   a first circuit formed by a resistor (6) in series with a first diode (5);
   a second circuit formed by a second diode (4); and
   a connecting element (8) controlled by a control unit (12) that controls the opening and closing thereof;
   where:
   the first gate resistor (21) and the second gate resistor (22) are connected in series between the positive connection of the voltage source (3) and the gate of the switching device (1);
   the first gate resistor (21) and the second gate resistor (22) are connected at an intermediate point (a);
   the anode of the first diode (5) is attached to the intermediate point (a) and its cathode is attached to the resistor (6) while at the same time the other end of the resistor (6) is attached to a linkage point (b);
   the cathode of the second diode (4) is attached to the intermediate point (a) and its anode is attached to the linkage point (b); and
   the linkage point (b) is attached to the capacitance (7) which in turn is in series with one end of the connecting element (8), the other end of said connecting element (8) being connected to the common point of the circuit (c) connected to the negative connection of the voltage source (3) and the emitter of the switching device (1).

2. Control system according to claim 1, characterized in that it comprises:
   a diode (9) in parallel with the first gate resistor (21), between the positive of the voltage source (3) and the intermediate point (a) where its anode is connected to the positive of the voltage source (3) and its cathode is connected to the intermediate point (a).

3. Control system according to claim 1, characterized in that it comprises:
   a Zener diode (10) in the second circuit, in series with the second diode (4) such that the anode of said second diode (4) is connected to the anode of the Zener diode (10) and the cathode of the Zener diode (10) is connected to the linkage point (b).

4. Control system according to claim 3, characterized in that it comprises:
   an amplifier stage (11) connected between a first intermediate point (e) and a second intermediate point (d), the first intermediate point (e) being defined by the attachment of the second circuit and the first gate resistor (21) and the second intermediate point (d) being defined by the first circuit and the second gate resistor (22).

5. Control system according to claim 3, characterized in that it comprises:
   an amplifier stage (11) connected between the intermediate point (a) and the second gate resistor (22).

6. Control system according to claim 4, characterized in that the amplifier stage (11) is a class B amplifier stage.

7. Control system according to claim 1, characterized in that it comprises a control unit (133) of the voltage source and a control unit (132) of the converter independent from one another.

8. Control system according to claim 1, characterized in that the control unit (132) of the converter integrates the control unit (133) of the voltage source.

9. Control system according to claim 8, characterized in that the control unit (132) of the converter integrates the control unit (133) of the voltage source and the control unit (12) of the connecting element.

10. Switching cell for an electronic converter comprising a capacitor for stabilizing the direct current voltage (13), two control systems (T1, T2) for switching devices (101, 102) in series and an output inductor (14) connected at the point of attachment of the switching devices (101, 102), characterized in that it comprises the control system described in claim 1 for each of the switching devices (101, 102) such that the time between switching off one switching device 101 and switching on the other switching device 102 is controlled.

11. Photovoltaic installation characterized in that it comprises a switching cell for an electronic DC/AC converter according to claim 10.

12. Control method for controlling a switching device (1) integrated in an electronic converter such as that described in claim 1 which consists of controlling the current derivative through said switching device (1) by means of its gate voltage, characterized in that it comprises:
   switching on the switching device (1) with the connecting element (8) closed so that the voltage source (3) applies positive voltage to the gate of the switching device (1)

through the first gate resistor (21) and the second gate resistor (22) and the capacitance (7) is charged through the first circuit;

switching off the switching device (1) with the connecting element (8) closed so that the voltage source (3) applies a voltage that discharges the capacitance (7) through the second circuit and the first gate resistor (21), causing the voltage of the gate of the switching device (1) to be that which is established by the capacitance (7) through the second diode (4) and the second gate resistor (22) to control the dynamics thereof by means of the first gate resistor and the value of the capacitance; or switching off or switching on the switching device (1) with the connecting element (8) open to control switch-on and switch-off through the first gate resistor (21) and the second gate resistor (22).

13. Control method according to claim 12, characterized in that it comprises connecting a control unit (133) of the voltage source and a control unit (132) of the converter.

14. Control method according to claim 13, characterized in that the switch-on and switch-off orders of the switching device (1) are assigned from the control unit (132) of the converter to the voltage source (3).

15. Control method according to claim 12, characterized in that after a specific direct current voltage level the connecting element (8) is closed by means of the control unit (12).

* * * * *